(12) United States Patent
Aubele et al.

(10) Patent No.: US 8,810,934 B2
(45) Date of Patent: Aug. 19, 2014

(54) POSITIONING METHOD FOR AN OPTICAL ARRANGEMENT OF A PROJECTION ILLUMINATION SYSTEM

(75) Inventors: Karl-Eugen Aubele, Geislingen/Steige (DE); Erich Merz, Essingen (DE); Thorsten Rassel, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 532 days.

(21) Appl. No.: 13/050,155

(22) Filed: Mar. 17, 2011

(65) Prior Publication Data

US 2011/0235005 A1  Sep. 29, 2011

(30) Foreign Application Priority Data

Mar. 29, 2010 (DE) .................. 10 2010 013 298

(51) Int. Cl.
*G02B 7/02* (2006.01)
*G03B 27/54* (2006.01)
*G03B 27/32* (2006.01)

(52) U.S. Cl.
USPC ............... 359/824; 355/77; 355/67; 359/823

(58) Field of Classification Search
CPC ............ G03F 7/70825; G03F 7/70258; G03F 7/70525; G02B 27/62
USPC ................................. 359/823, 824
See application file for complete search history.

(56) References Cited

U.S. PATENT DOCUMENTS

| 6,150,750 | A | 11/2000 | Burov et al. |
| 6,301,441 | B1 | 10/2001 | Kato et al. |
| 6,759,670 | B2 | 7/2004 | Aubele |
| 7,035,056 | B2 | 4/2006 | Franken et al. |
| 7,423,824 | B2 | 9/2008 | Yamashita et al. |

(Continued)

FOREIGN PATENT DOCUMENTS

| CN | 1637608 | 7/2005 |
| DE | 102 25 266 A1 | 7/2003 |

(Continued)

OTHER PUBLICATIONS

English translation of Office Action for corresponding JP Application No. 2011-071095, dated Aug. 9, 2011.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

The present disclosure relates to a method for the production and/or adjustment of an optical arrangement of a projection illumination system, in which at least one actuator is used to set the position of at least one optical element to be manipulated by moving the optical element incrementally with a specific increment size. The increment size of the movement increments is set as a function of the distance of the optical element from the desired position, with the distance being represented by a distance value. If the distance value is above a first threshold value, a substantially constant increment size is set, while the specific increment size decreases as the distance from the desired position decreases if the distance value is below the first threshold value. Alternatively or additionally, a pre-specified deviation from the specific increment size and/or from a pre-specified increment size change rate results in a warning signal and/or ceasing of the movement.

20 Claims, 2 Drawing Sheets

(56) References Cited

U.S. PATENT DOCUMENTS

| | | |
|---|---|---|
| 2005/0024609 A1 | 2/2005 | De Smit et al. |
| 2006/0164619 A1 | 7/2006 | Back et al. |
| 2007/0002152 A1* | 1/2007 | Fujiwara ................ 348/252 |
| 2008/0080070 A1 | 4/2008 | Aubele et al. |
| 2010/0097020 A1* | 4/2010 | Kiyamura et al. ....... 318/400.11 |

FOREIGN PATENT DOCUMENTS

| | | |
|---|---|---|
| JP | 58-166328 A | 10/1983 |
| JP | 60-173613 | 9/1985 |
| JP | 3-249630 | 11/1991 |
| JP | 4-44104 | 2/1992 |
| JP | 6-313833 | 11/1994 |
| JP | 7-159150 | 6/1995 |
| JP | 9-033788 | 2/1997 |
| JP | 11-511956 | 10/1999 |
| JP | 2001-83397 | 3/2001 |
| JP | 2002-036373 | 2/2002 |
| JP | 2002-361598 | 12/2002 |
| JP | 2003-264985 | 9/2003 |
| JP | 2003-324028 | 11/2003 |
| JP | 2005-513767 | 5/2005 |
| JP | 2006-50856 | 2/2006 |
| JP | 2006-345629 | 12/2006 |

OTHER PUBLICATIONS

English translation of Japanese Office Action for corresponding JP Appl No. 2011-071095, dated Dec. 26, 2011.
Chinese Office Action, with translation thereof, for CN Appl No. 2011-10076475.5, dated Feb. 27, 2014.

\* cited by examiner

POSITIONING METHOD FOR AN OPTICAL ARRANGEMENT OF A PROJECTION ILLUMINATION SYSTEM

CROSS-REFERENCE TO RELATED APPLICATIONS

This application claims priority under 35 U.S.C. §119 to German Application No. 10 2010 013 298.5, filed Mar. 29, 2010, which is hereby incorporated by reference in its entirety.

FIELD

The disclosure relates to a method for producing and/or adjusting an optical arrangement of a projection illumination system, in which at least one actuator is used to set the position of at least one optical element to be manipulated by moving the optical element incrementally with a specific increment size.

BACKGROUND

Projection illumination systems are used for the microlithographic production of microelectronic devices, in particular semiconductor devices or devices for micro- and nano-technology. In order to produce structures with very small dimensions, it is desirable to image the structures in the projection illumination system with a high degree of accuracy. Even the smallest changes in the optical elements used in the projection illumination system with respect to their form, composition or their position in the optical arrangement can result in corresponding aberrations and thus to defectiveness of the devices to be produced.

Accordingly it is known to use methods for positioning and/or adjusting optical elements in optical arrangements of a projection illumination system, which methods conform to the highest desired properties in terms of the accuracy of the positioning. DE 102 25 266 A1, for example, describes an imaging apparatus of a projection illumination system for microlithography, in which manipulators with piezoactuators are used in order to manipulate and position relevant optical elements, such as for example optical lenses, mirrors or the like.

The disclosure of DE 102 25 266 A1 and of U.S. Pat. No. 6,150,750, which describes piezoactuators in the form of linear piezo drives, are incorporated by reference herein in their entirety.

Although a very exact positioning of optical elements is already possible with the linear piezo drives, as they are described in the previously mentioned documents, there is furthermore a desire for efficient operating methods which enable, in addition to simple and effective operation of the manipulators, at the same time extremely exact positioning with a high degree of accuracy.

It has been shown that the fact that the movement of the linear piezo drives and/or the movement of the optical elements which are moved thereby or of the gear elements such as actuating levers or the like which are possibly provided between the optical element to be manipulated and the linear piezo drive is delimited by abutment elements results in interactions with the abutment element possibly resulting in influences on the optical element. When the abutment element comes into contact in the peripheral movement region of the manipulation apparatus, the optical element can be negatively affected with corresponding negative effects on the imaging properties. It is desirable for this reason to use a corresponding positioning method which takes into account these possible negative influences.

SUMMARY

The disclosure seeks to provide a method for producing, setting and/or adjusting an optical arrangement, in particular for positioning an optical element in an optical arrangement of a projection illumination system, in which exact positioning is possible in a simple and effective manner by way of incremental movement of the optical element.

In addition, a negative influence of abutment elements, which delimit the movement region, is intended to be avoided.

The disclosure proceeds from the knowledge that for exact and effective positioning of an element in an optical arrangement of a projection illumination system, in the case of an incremental movement of the optical element by at least one (preferably more than one) actuator (such, as for, example piezoactuators, and preferably linear piezo drives), the problems described above can be solved in a simple manner by setting the increments and by detecting the deviation from a pre-specified increment size.

Accordingly, according to a first aspect of the present disclosure, the incremental movement of the optical element is intended to be performed such that the increment size is set as a function of the distance of the optical element from the desired position, with the distance of the optical element from the desired position being represented by a distance value. This distance value can be given by a simple displacement value or by a displacement vector, which additionally gives the corresponding directions. In particular it is possible, however, preferably when using a simple one-dimensional displacement value as the distance value, that the disclosure (as will be described below for example for an individual linear piezo drive) is designed for a plurality of linear piezo drives at the same time, which linear piezo drives are responsible for the movement in different independent spatial directions, such as for example in the directions of the X-, Y- and Z-axes of a Cartesian coordinate system.

According to the disclosure, the increment size for approaching the optical element to be manipulated from an instantaneous position to a desired position should initially be set as a constant increment size, for example the maximum increment size of the actuator, as long as the distance value is above a first threshold value. If the distance value is below the threshold value, the increment size is reduced in accordance with the decrease of the distance value. Owing to the first approaching movement with a constant, especially maximum, increment size up to a first threshold value, a fast approaching movement to the desired position can take place. Once the distance value falls below the first threshold value, the increment size is reduced in order to enable an exact approaching movement to the desired position. Exact positioning can be carried out by way of repeated performance of the corresponding approaching cycle with a check of whether the distance value is below or above the first threshold value, that is to say what the instantaneous position relative to the desired position is, and of a corresponding performance of the movement increments according to the result of the check.

According to a further aspect of the present disclosure (which can be implemented itself and/or in conjunction with the first aspect of the disclosure noted above), a deviation of the increment size from the pre-specified increment size and/or the deviation of an increment size change rate from a pre-specified increment size change rate, that is to say the deviation of the movement velocity from a pre-specified movement velocity or the deviation of a movement acceleration or deceleration from a pre-specified movement acceleration or deceleration, is used as an indication of the optical element approaching an abutment element, such that either an appropriate warning signal can be emitted and/or the movement can be stopped. If the optical element is moved by the manipulators into the region of an abutment element, an additional movement of up to a size range of 0.5 µm can take place due to appropriate matching processes after first contact of the optical element, or the actuator and gear devices that are connected in-between, before the final physical stop of the optical element occurs. However, negative effects on the optical element are assumed from the very first contact, and therefore this first contact can already be determined by the method according to the disclosure.

Accordingly, this advantageous method can also be used independently of an actual positioning and/or adjustment of an optical element for ascertaining the movement region. In this case, the movement in the direction of the abutment element is performed with a pre-specified or maximum increment size until first contact can be ascertained on the basis of the deviation of the increment size or the increment size change rate from pre-specified values. In other words, with a pre-specified constant movement velocity, that is to say a constant increment size per movement increment, the deviation from this constant movement velocity outside a pre-specified acceptable range can be taken as an indication of a contact with the abutment element, such that this first contact point can already be used to determine the end of the movement region.

In the method according to the disclosure for the production and/or adjustment of an optical arrangement of a projection illumination system, the movement increments can be performed repeatedly, wherein individual approaching cycles can contain a plurality of movement increments or individual movement increments. The approaching cycles can be performed repeatedly until the desired positioning is achieved.

Moreover, a control loop and at least one position sensor, preferably a plurality of position sensors, in particular capacitive position sensors, can be provided, wherein a corresponding distance value can be ascertained by way of ascertaining the instantaneous position of the optical element to be manipulated using the position sensors and comparing it to the desired position, which distance value can in turn serve the control loop for the determination of the increment size in the next approaching cycle or in the next movement increment. Alternatively, the distance value can also be input directly, if no position sensors are available and the distance value can be ascertained by another mechanism.

The first threshold value can be in particular be given by the maximum increment size of the actuator or actuators. Accordingly, it is possible, if a distance value is above this first threshold value, to always perform a movement increment with the maximum increment size of the actuator, without running the risk of going beyond the desired position.

If a distance value is below this first threshold value, it is possible to perform a movement increment with a correspondingly reduced increment size as a function of the distance value.

The positioning method according to the disclosure can be supplemented by determining a second threshold value that corresponds to a distance value which is greater than the first threshold value. If the distance value, which is input into the system or determined by the control loop or the position sensors, of the actual position of the optical element from the desired position is greater than the second threshold value, a first approaching movement can take place by way of the distance value being reduced by a specific factor and by way of a plurality of movement increments with maximum increment size being performed in accordance with this reduced distance value, which results in a position, which corresponds to the reduced distance value, being reached or approached. Reducing the distance value by a specific factor in turn ensures that the desired position is not overshot.

If the distance value is below the second threshold value, a second phase of the approaching movement can occur, in each case by way of a movement increment with maximum increment size being performed until the first threshold value is reached.

The real behavior, or non-ideal behavior, of the manipulator or of the actuators can be taken into account by the actually traveled section of the previous movement increment and/or the pre-specified increment size of the previous movement increment being used as the input variables for determining the increment size of the next movement increment. In this manner it is possible to take into account the actual and under certain circumstances different conditions for various actuators in the method, which results in an improved positioning accuracy and effectiveness of the positioning method.

BRIEF DESCRIPTION OF THE DRAWINGS

Other advantages, characteristics and features of the present disclosure will become apparent in the following detailed description of an exemplary embodiment with reference to the appended drawings. Here, the drawings show, purely schematically, FIG. 1 a distance time graph, the time being plotted as increment numbers.

DETAILED DESCRIPTION

Figure 1:
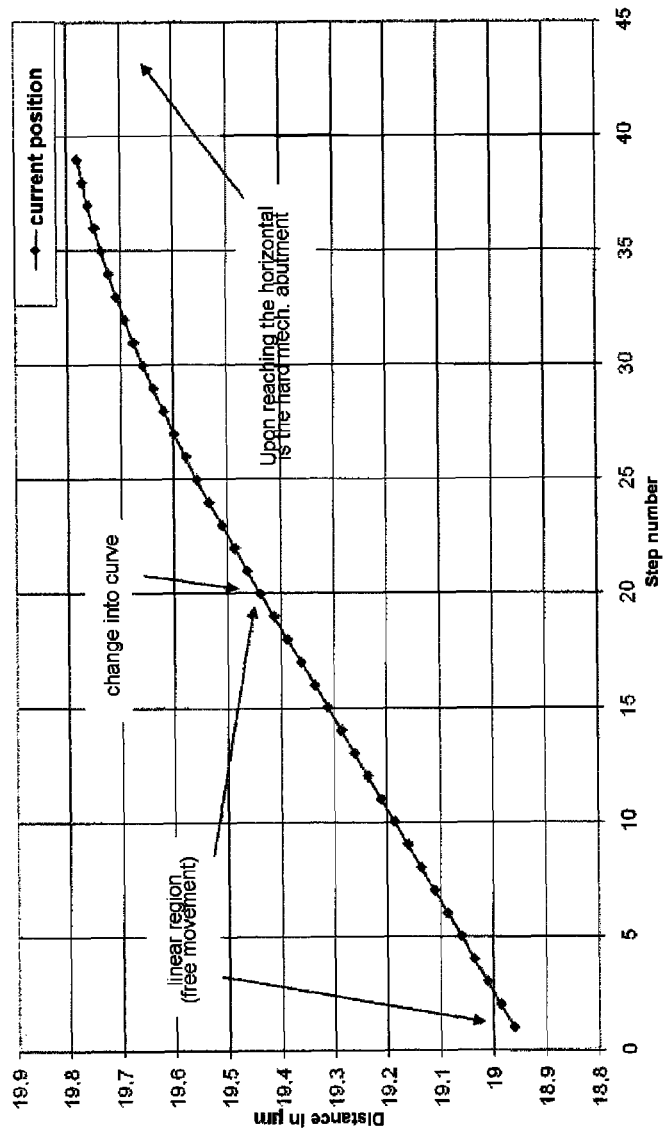

According to an embodiment of the present disclosure, an optical element is positioned by way of the optical element incrementally approaching the desired position. To this end, first the instantaneous position of the optical element is determined, with the result that a distance value can be ascertained from a comparison between the instantaneous position and the desired position. The distance value can in this case include a pure displacement value or a plurality of displacement values and also directional information in the manner of a distance vector.

According to an exemplary embodiment of the disclosure, a check is carried out in a first step whether the distance value is above a second threshold value, that is to say if the instantaneous position is further removed from the desired position than the second threshold value. In this case, the distance from the instantaneous position to the desired position is thus still so great that initially a further approaching movement toward the instantaneous position is desirable. This is performed in that the distance value is reduced by a specific factor, for example is multiplied by the factor 0.8 or 0.6, and, in accordance with this reduced distance value, the number of movement increments with maximum increment size of the actuator or actuators to be used is ascertained, which are desired to travel the reduced distance value. If, for example, the distance of the instantaneous position from the desired position is set to 40 µm and the second threshold value is set to 30 µm, then following a multiplication of the distance value 40 µm by the factor 0.6, the reduced distance value 24 µm is ascertained. As a result, for a maximum increment size of 3

μm for a movement increment, eight movement increments with an increment size of in each case 3 μm are performed. If the movement increments were performed according to the theoretical values, the optical element to be positioned and manipulated would thus approach the instantaneous position to a distance of up to 16 μm. However, since the real performance of the movement increments can contain deviations, the actual instantaneous position can deviate from the theoretical instantaneous position, with the result that a distance value greater or smaller than 16 μm is conceivable for the next approaching cycle.

Accordingly, in the next approaching cycle, first the actual instantaneous position is ascertained using position sensors. Any sensors which are suitable for ascertaining the actual position can be used as position sensors, in particular capacitive sensors, for example.

From this ascertained second instantaneous position, a distance value, which can now be 16.5 μm, for example, is determined in turn for the second approaching cycle. This second distance value of the second approaching cycle is below the second threshold value of 30 μm, such that no plurality of movement increments with maximum increment size is performed in the second approaching cycle anymore, but only one individual movement increment. However, first a check is carried out whether the distance value of 16.5 μm is above or below the first threshold value. For a maximum increment size of the actuator of 3 μm, the first threshold value can be fixed at 3 μm. Accordingly, for the second approaching cycle, the second distance value of 16.5 μm is above the first threshold value, and therefore a movement increment with maximum increment size of 3 μm is performed. Theoretically this leads to an approaching movement through 3 μm in the direction of the instantaneous position, with the result that the distance value should now be 13.5 μm. However, it is again possible for the real movement increment to deviate here, with the result that once more the actual instantaneous position is determined using the position sensor(s).

Further approaching cycles are performed below, wherein the current distance value is repeatedly determined and compared to the first threshold value. As long as the current distance value is greater than the first threshold value, in each case a movement increment with the maximum increment size of 3 μm is performed. However, as soon as the ascertained distance value is below the first threshold value in an approaching cycle, the increment size of the movement increment to be performed is adapted accordingly, that is to say reduced. In this form, further approaching cycles are performed until the ascertained instantaneous position of the optical element is within a pre-specified deviation range which is tolerated and permissible. The positioning of the optical element during production or setting of a corresponding optical arrangement and the corresponding adjustment of the optical element in the optical arrangement is then complete.

In the preferred exemplary embodiment, piezoactuators, in particular linear piezo drives, are used as the actuators, such as are described, for example, in DE 102 25 266 A1 and U.S. Pat. No. 6,150,750 A. The entire disclosure of each of these documents is incorporated herein by reference.

The piezoactuators are actuated via the application of specific stresses, in particular shear stresses, such that the procedure described above for specific distances and path sections or increment sizes can also be performed on the plane of the stresses to be applied. This means that a stress value for the actuation of the piezoactuator can be ascertained directly from the distance value, for example, which can correspondingly likewise be changed in accordance with the preceding description.

In an exemplary embodiment according to the disclosure, a non-ideal behavior of the manipulator or actuator can be taken into account by incorporating the section of the last movement increment into the calculation of the next movement increment.

In addition, in particular in the last phase of the approaching movement in the direction of the desired position, the set increment size of the last movement increment or the set stress value can be stored for the actuation of the piezoactuator and used to calculate the increment size of the next movement increment or the corresponding stress value, for example as a corresponding start value.

In this way it is possible to realize a reliable and exact approaching movement or setting of the optical element in the desired position using the method according to the disclosure.

Furthermore, a corresponding control loop can be realized, which uses the instantaneous positions of the object to be manipulated, as ascertained by position sensors, for determining the movement increments to be performed. A corresponding control loop can be realized by way of known electrotechnical/information-technological embodiments.

A corresponding manipulation or positioning of an optical element should typically be performed such that the optical element to be manipulated can be moved freely. However, in most cases the movement region of the optical element is delimited, wherein abutment elements, which delimit the movement region, can be provided for the optical element or the corresponding actuators or gear devices connected thereto such as actuating levers and the like in order to avoid damage and the like.

In this case it can happen that the desired position to be set is located near an abutment. If contact with an abutment element takes place, what are referred to as parasitic defects can be introduced into the optical element in this way, which can lead to a worsening of the imaging behavior, such as astigmatism, tilting of the optical element and so on. These defects can in particular already be produced upon first contact with the abutment although the optical element can still travel a limited section, such as a distance of 0.5 μm or the like. Accordingly, it is important to ascertain the location or the time of first contact with an abutment element even before the final stop position of the optical element or of the actuator apparatus at the abutment element (abutment position) in order to prevent further movement of the optical element in the direction of the abutment element and thus avoid the introduction of corresponding defects.

Figure 2:
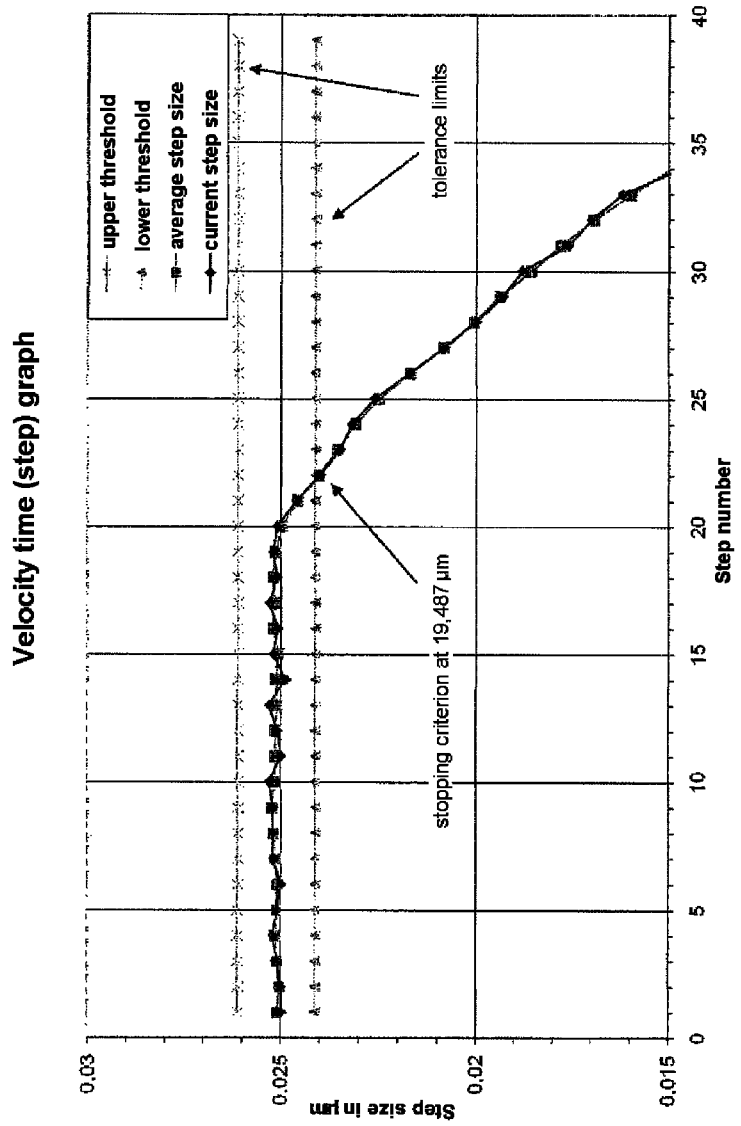
FIG. 2 a velocity time graph, the time again being plotted as increment numbers.

This is shown in FIGS. 1 and 2. FIG. 1 shows a distance time graph, in which an optical element is moved using a piezoactuator with maximum increment size in the direction of an abutment. The distance time graph initially has a linear region, in which the optical element can move freely and the corresponding effects on the optical element and thus the defect generation is low. A correspondingly linear region is present up to an increment number 20.

From first contact of the optical element or the actuators or corresponding gear devices with the abutment element, the movement velocity changes, that is to say the increment size per movement increment up to the final stop of the movement. The movement velocity or the increment size per movement increment accordingly resets to 0. In this second region of the reduced movement velocity, however, an interaction with the optical element takes place already, which can lead to what is referred to as parasitic defects and the worsening of the imaging properties. Accordingly, and according to a second aspect of the present disclosure, the first contact point of the optical element or the actuators or corresponding gear devices with an abutment element is determined during the production or setting or adjustment of an optical element or an optical arrangement in a projection illumination system and/or independently thereof in a separate method in order to delimit the movement region accordingly and to avoid the influencing of the optical element which can lead to parasitic defects.

This can be determined in particular with the aid of a velocity time graph, as is shown in FIG. 2. Here, the increment size is plotted against the increment number, resulting in a velocity time graph. In the linear region, the velocity is constant, for example at a value of 0.03 µm, as shown in an exemplary embodiment. As soon as an interaction with the abutment element occurs, the increment size or the movement velocity changes, for example by departure from a pre-specified velocity range, so that the first contact point can be simply determined in terms of space or time. In the same way, it would also be possible to use an acceleration time graph for ascertaining the first contact point, which graph would result from the differentiation of the velocity time graph with respect to time.

In the graph in FIG. 2, accordingly an upper and a lower threshold are given, which specify the permissible deviation of the increment size. If the increment size deviates beyond these thresholds, contact with the abutment element is accordingly assumed.

The method for determining the first contact of an optical element to be manipulated with an abutment element can be performed both separately, as is shown in FIGS. 1 and 2, or can be integrated in the above method for positioning an optical element. In a separate embodiment, the optical element is preferably moved with maximum increment sizes in the direction of the abutment element until the contact with the abutment element is ascertained by way of the ascertained change in the increment size or the velocity or the change in the acceleration or the increment size change rate.

In the case of integration into the positioning or adjustment method, the detection, according to the disclosure, of the deviation of the movement velocity or acceleration or deceleration beyond a pre-specified value can be used as a warning signal of interaction with an abutment element for alerting the operator and/or avoiding any further movement.

It is possible in this way using the method according to the disclosure to perform very exact positioning of an optical element and to avoid the introduction of undesired defect sources.

Although the present disclosure has been described in detail with reference to exemplary embodiments, it is self-evident for a person skilled in the art that the disclosure is not restricted to these exemplary embodiments but rather that modifications are possible of the kind such that individual features can be omitted or the features can be used in different combinations, as long as there is no departure from the scope of protection of the appended claims. In particular, the present disclosure includes all combinations of all the disclosure features presented.

What is claimed is:

1. A method of setting a position of an optical element using an actuator, the optical element being a member of an optical arrangement of a projection illumination system, the method comprising:
setting an increment size by which the actuator moves the optical element based on a distance of the optical element from a desired position of the optical element, wherein:
the distance of the optical element from the desired position of the optical element is represented by a distance value,
if the distance value is above a first threshold value, the increment size is substantially constant; and
if the distance value is below the first threshold value, the increment size decreases as the distance of the optical element from the desired position decreases.

2. The method of claim 1, further comprising, after setting the increment size, using the actuator to move the optical element based on the increment size, thereby changing the distance of the optical element from the desired position of the optical element to a second distance.

3. The method of claim 2, further comprising, after using the actuator to move the optical element, re-setting the increment size by which the actuator moves the optical element based on the second distance,
wherein:
the second distance is represented by a second distance value,
if the second distance value is above a first threshold value, the increment size is substantially constant; and
if the second distance value is below the first threshold value, the increment size decreases as the distance of the optical element from the desired position decreases.

4. The method of claim 1, wherein the method is used to produce the optical arrangement.

5. The method of claim 1, wherein the method is used to adjust the optical arrangement.

6. The method of claim 1, wherein the projection illumination system is a microlithography projection illumination system.

7. The method of claim 1, wherein:
a pre-specified deviation from a parameter results in an action;
the parameter comprises a member selected from the group consisting of the increment size and a pre-specified increment size change rate; and
the action comprises a member selected from the group consisting of a warning signal and cessation of movement of the optical element.

8. The method of claim 1, further comprising using a position sensor to determine the position of the optical element.

9. The method of claim 8, further comprising using a control loop which, based on the position determined by the position sensor, determines the increment size.

10. The method of claim 1, wherein the distance value is above the first threshold value, and the substantially constant increment size is a maximum increment size of the actuator.

11. The method of claim 1, wherein the distance value is below the first threshold value, and the method further comprises using the actuator to move the optical element by an increment size which is reduced according to the distance value.

12. The method of claim 1, wherein:
a second threshold value is greater than the first threshold value;
the distance value is greater than the second threshold value; and
the method further comprises:
reducing the distance value to a second distance value; and
using the actuator to move the optical element by a plurality of increments to reduce the distance between the optical element and the desired position of the optical element to the second distance value.

13. The method of claim 12, wherein each of the plurality of increments is a maximum increment size of the actuator.

14. The method of claim 1, wherein:
a second threshold value is greater than the first threshold value,
the distance value is between the first and second threshold values;
the method further comprises using the actuator to move the optical element by a plurality of increments to reduce the distance between the optical element and the desired position of the optical element to the first threshold value.

15. The method of claim 14, wherein each of the plurality of increments is a maximum increment size of the actuator.

16. The method of claim 14, wherein the optical element is moved by the plurality of increments until the distance value is equal to or less than the first threshold value.

17. The method of claim 1, further comprising:
determining at least one parameter selected from the group consisting of an actually traveled distance of a previous movement increment and a pre-specified increment size of the previous movement increment; and
using the at least one parement to determine the increment size of the next movement increment.

18. The method of claim 1, further comprising using at least one parameter to determine an abutment position of the optical element independently of the setting of a position of the optical element, wherein the at least one parameter is selected from the group consisting of a pre-specified deviation from the increment size, a maximum increment size and a pre-specified increment size change rate.

19. The method of claim 1, wherein the actuator comprises an actuator selected from the group consisting of a piezoactuator and a linear piezo drive.

20. The method of claim 1, wherein the actuator comprises a plurality of actuators.

* * * * *

UNITED STATES PATENT AND TRADEMARK OFFICE
CERTIFICATE OF CORRECTION

| | |
|---|---|
| PATENT NO. | : 8,810,934 B2 |
| APPLICATION NO. | : 13/050155 |
| DATED | : August 19, 2014 |
| INVENTOR(S) | : Karl-Eugen Aubele et al. |

It is certified that error appears in the above-identified patent and that said Letters Patent is hereby corrected as shown below:

In the Claims

In Col. 10, line 6, in Claim 17, delete "parement" and insert -- parameter --.

Signed and Sealed this
Eleventh Day of November, 2014

Michelle K. Lee
*Deputy Director of the United States Patent and Trademark Office*